(12) United States Patent
Oh

(10) Patent No.: US 6,275,441 B1
(45) Date of Patent: Aug. 14, 2001

(54) DATA INPUT/OUTPUT SYSTEM FOR MULTIPLE DATA RATE MEMORY DEVICES

(75) Inventor: Jong-Hoon Oh, Fremont, CA (US)

(73) Assignee: G-Link Technology, Santa Clara, CA (US)

(*) Notice: Subject to any disclaimer, the term of this patent is extended or adjusted under 35 U.S.C. 154(b) by 0 days.

(21) Appl. No.: 09/588,994

(22) Filed: Jun. 6, 2000

Related U.S. Application Data

(60) Provisional application No. 60/138,918, filed on Jun. 11, 1999.

(51) Int. Cl.[7] .................................................. G11C 8/00
(52) U.S. Cl. ............................. 365/230.04; 365/230.03; 365/203; 365/230.08; 365/233
(58) Field of Search .......................... 365/230.04, 230.03, 365/203, 230.08, 233

(56) References Cited

U.S. PATENT DOCUMENTS

| | | | |
|---|---|---|---|
| 5,748,917 | * 5/1998 | Krein et al. ............................. | 395/306 |
| 5,802,387 | * 9/1998 | Boddie et al. .................. | 395/800.42 |
| 5,978,884 | * 11/1999 | Yamaguchi et al. ................. | 711/100 |
| 6,061,779 | * 5/2000 | Garde ................................... | 712/204 |
| 6,130,558 | * 10/2000 | Lee ......................................... | 326/93 |

* cited by examiner

*Primary Examiner*—David Nelms
*Assistant Examiner*—Connie C. Yoha
(74) *Attorney, Agent, or Firm*—Townsend & Townsend & Crew LLP

(57) ABSTRACT

Methods and circuitry for implementing memory devices with I/O architectures that transmit multiple data bits on a data I/O interconnect line during a single clock cycle. Instead of increasing the physical number of I/O interconnect lines to match the increased number of data bits being processed by the multiple data rate memory circuit, a time sharing scheme is devised that processes the multiple bits of data with a minimum number of I/O lines.

12 Claims, 3 Drawing Sheets

DATA INPUT/OUTPUT SYSTEM FOR MULTIPLE DATA RATE MEMORY DEVICES

CROSS-REFERENCES TO RELATED APPLICATIONS

This application derives priority from U.S. provisional patent application no. 60/138,918, titled "High Bandwidth Read/Write System for Memory Devices," filed Jun. 11, 1999, which is incorporated herein in its entirety.

BACKGROUND OF THE INVENTION

The present invention relates in general to integrated circuits and in particular to input/output (I/O) architecture and read/write system for high bandwidth semiconductor memories.

Increasing speed of operation and bandwidth have been major driving forces behind evolutionary changes in the design and development of memory circuits. In the case of dynamic random access memories (DRAMs), for example, the extended data output (EDO) architecture was developed to enhance memory bandwidth. With the introduction of the synchronous DRAM (SDRAM), the ability to pipeline the data as well as data pre-fetch schemes have helped increase the speed, throughput and bandwidth of the memory. This increase in bandwidth has not in all cases been without a tradeoff. The double data rate, or DDR SDRAM, for example, takes advantage of a two-bit pre-fetch technique to double the bandwidth of the memory circuit. This has been extended to quad data rate and above.

One drawback of these types of multiple data rate SDRAMs has been the corresponding increase in the number of I/O interconnect lines required to process the multiple bits during read and write operations. For example, in a DDR SDRAM having a by N (or xN, e.g., x16 or x32) organization, a 2-bit pre-fetch results in 2N bits of data being output from the memory array in read mode. Typically the total columns in an array are divided into two sets of even and odd columns, each delivering N bits of data. The 2N columns connect to a corresponding 2N sense amplifiers, with the 2N sense amplifiers driving 2N global I/O lines. A 2:1 parallel to serial conversion at the output takes place before the data is applied to the N data output (DQ) registers. The process is reversed for the write mode of operation wherein a serial-to-parallel conversion turns a serial bit stream into pairs of bits for DDR (quad bits for QDR, etc.).

Accordingly, a DDR SDRAM that has, for example, a x32 organization and uses a complementary global I/O bus architecture (i.e., pair of lines per bit), requires 128 global I/O interconnect lines. Given an exemplary 2 micron pitch for each interconnect line, the 128 lines take up about 256 $\mu$m which may be as much as 5% of the die size. This large number of global I/O lines therefore appreciably increases the overall size and cost of the memory device.

SUMMARY OF THE INVENTION

The present invention provides methods and circuitry for implementing memory devices with I/O architectures that transmit multiple data bits on a data I/O interconnect line during a single clock cycle. Instead of increasing the physical number of I/O interconnect lines to match the increased number of data bits being processed by the multiple data rate memory circuit, the present invention provides a time sharing scheme that processes the multiple bits of data with a minimum number of I/O lines. In specific embodiments, the time sharing is accomplished in a self-timed manner to ensure accurate operation. In other embodiments, the present invention provides for further improvements by eliminating precharging when not necessary, and by using N double-ended data buses to transmit 2N single-ended data bits during the write mode of operation.

Accordingly, in one embodiment, the present invention provides a memory circuit that operates according to a periodic clock signal, the memory circuit including a plurality of data registers respectively coupled to a corresponding plurality of data buses, wherein the circuit is configured such that each data bus is capable of carrying more than one bit of data during a single period of the periodic clock signal. Further, the circuit is configured such that the more than one bit of data are transmitted in a self-timed manner wherein one edge of a first bit of data triggers an edge of a succeeding bit of data. In a specific embodiment, the circuit of the present invention further includes precharge control circuitry that is coupled to the plurality of data buses and is configured to precharge a data bus during the single period of the periodic clock only if the more than one data bits are different in binary value. In yet another specific embodiment, each of the plurality of data buses comprises a pair of interconnect lines to process double-ended read data bits, and the circuit is further configured to process single-ended data bits in write mode, wherein each interconnect line in the plurality of data buses carries one single-ended bit of write data during write mode.

In another embodiment the present invention provides in a synchronous memory circuit that has N data registers coupled to N data buses and operates according to a periodic clock signal, a method of transmitting data that includes transmitting a first bit of data during a first portion of a single period of the clock signal, and transmitting a second bit of data during a second portion of the single period of the clock signal. The method further including triggering an edge of the second bit of data in response to an edge of the first bit of data.

In yet another embodiment, the present invention provides a method of operating a semiconductor memory device, including: selecting a plurality of data in one clock cycle from an array of memory cells in read mode; determining a sequence of the plurality of data; time shifting each of the plurality of data according to the sequence; and driving the plurality of data onto a single data bus in the sequence within one clock cycle.

A better understanding of the nature and advantages of the data I/O technique of the present invention may be gained with reference to the following detailed description and the accompanying drawings.

DETAILED DESCRIPTION OF SPECIFIC EMBODIMENTS

Figure 1:
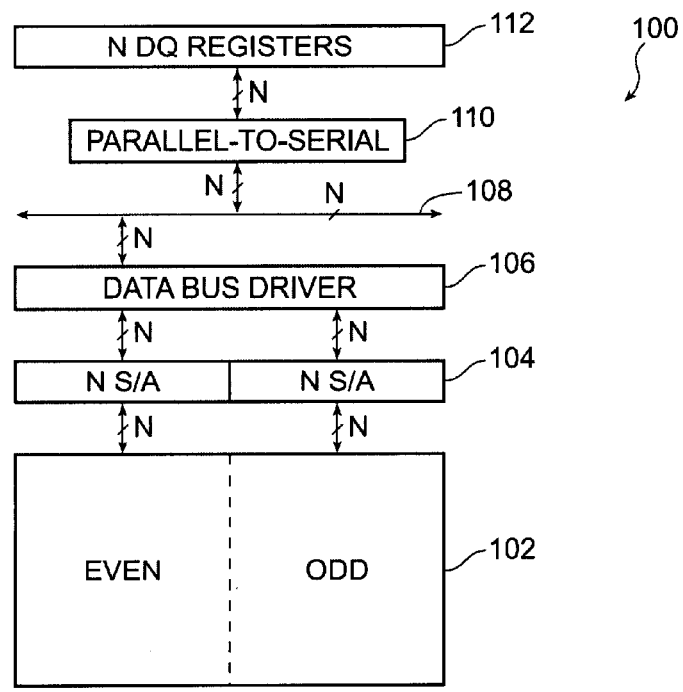
FIG. 1 shows a simplified block diagram of a memory circuit according to one embodiment of the present invention.

The present invention provides methods and circuitry for implementing memory devices with data I/O architectures that transmit multiple data bits on a data I/O interconnect line during a single clock cycle. For illustrative purposes only, the invention is described in the context of a synchronous memory device that uses a two-bit pre-fetch technique to double the data rate of the memory. It is to be understood that the present invention is not limited to a double data rate memory, and that the teachings of the invention also apply to higher data rates such as quad data rate and above. Referring to FIG. 1, there is shown a simplified block diagram showing the read data path for a memory circuit 100 according to an exemplary embodiment of the present invention. Memory circuit 100 includes an array 102 of memory cells that are arranged in a matrix of rows and columns as is known in the art. To facilitate the two-bit pre-fetch scheme, array 102 is divided into even columns and odd columns, each half producing N bits of read data during a single clock cycle. There is a first set of N read sense amplifiers 104 that respectively receive the N bits of read data from the even columns, and a second set of N read sense amplifiers 104 that respectively receive the N bits of read data from the odd columns. A data bus driver 106 receives the 2N bits of data from the total of 2N read sense amplifiers, time shifts one with respect to the other within a single clock cycle, and drives 2N bits of data onto an N wide data bus 108. A parallel-to-serial converter performs a 2:1 conversion and serially applies 2N bits of read data to N data (or DQ) registers 112. Bus driver 106, therefore, operates to eliminate the need to double the number of data buses.

The operation of data bus driver 106 will be described in greater detail hereinafter in connection with the timing diagram of FIG. 2 and the exemplary circuit implementation shown in FIG. 3. When performing a read operation, an even column and an odd column are both selected during one clock cycle. I/O sense amplifiers 302 and 303 respectively receive the signals from the selected even column and odd column, and amplify the signal in response to a sense amplifier enable or read strobe signal Rd_Stb. To allow for transmitting two bits of data during a single clock cycle, the data bus driver of the present invention time shifts one with respect to the other within the one clock cycle window of time. Since the starting column address is random, it is not known whether the odd column or the even column requires shifting. The bus driver includes a first stage 320 that determines the sequence of the data from each array. To accomplish this, the circuit provides a direct path and a time shifted path for both outputs of the sense amplifiers. Referring to FIG. 3, the bus driver includes 2:1 select circuits or multiplexers (MUXes) 304 and 305. MUX 304 receives the output Q_e of sense amplifier 302 directly at one input, and the output of AND gate 316 whose inputs are a latched output Qd_e via latch 306, and Ld_Even from AND gate 312, at another input. Similarly, MUX 305 receives the output Q_o of sense amplifier 303 directly at one input, and the output of AND gate 317 whose inputs are a latched output Qd_o via a latch 307, and Ld_Odd from AND gate 313, at another input. Latches 306 and 307 provide the necessary time shift, and the combination of AND gates 312, 313, 316, 317 and MUXes 304 and 305 selectively pass through either the direct sense amplifier output or the shifted version in response to a control signal. In the exemplary embodiment shown in FIG. 3, the control signal, Odd_Start, for MUXes 306 and 307 is a level signal such that, when high, it indicates that the odd column is selected first with the even column being next, and when low, it indicates the opposite. Thus, when Odd_Start is low, for example, MUX 304 selects the direct output of even sense amplifier 302, and MUX 305 selects the shifted output of odd sense amplifier 303.

A second stage 340 of the bus driver drives the two bits of data onto the data bus according to the determined sequence. The outputs of MUXes 304 and 305, Ev_q and Od_Q, are respectively coupled to driver circuits 308 and 309 that drive the data onto the data bus 310. The timing of the driver circuit input signals Ev_q and Od_Q is controlled to ensure that they occur within the period defined by one clock cycle. This is preferably accomplished in a self_timed manner. Accordingly, in the exemplary embodiment shown in FIG. 3, AND gates 312 and 313 selectively drive a time-shifted version of the Rd_Stb signal, Ld_Shifted depending on the status of the Odd_Start signal. The signal Ld_Shifted is generated using an edge of the Rd_Stb signal. AND gates 312 and 313 respectively receive the signal Odd_Start (or one derived from it through an optional delay 314), and its inverse through inverter 315. Accordingly, referring back to the above example where Odd_start is low, AND gate 312 drives its output Ld_Even low, and AND gate 313 drives its output Ld_Odd high when Ld_Shifted is also asserted. In this fashion, driver 308 drives the data from the even column first, followed by driver 309 driving the data from the odd column.

Figure 2:
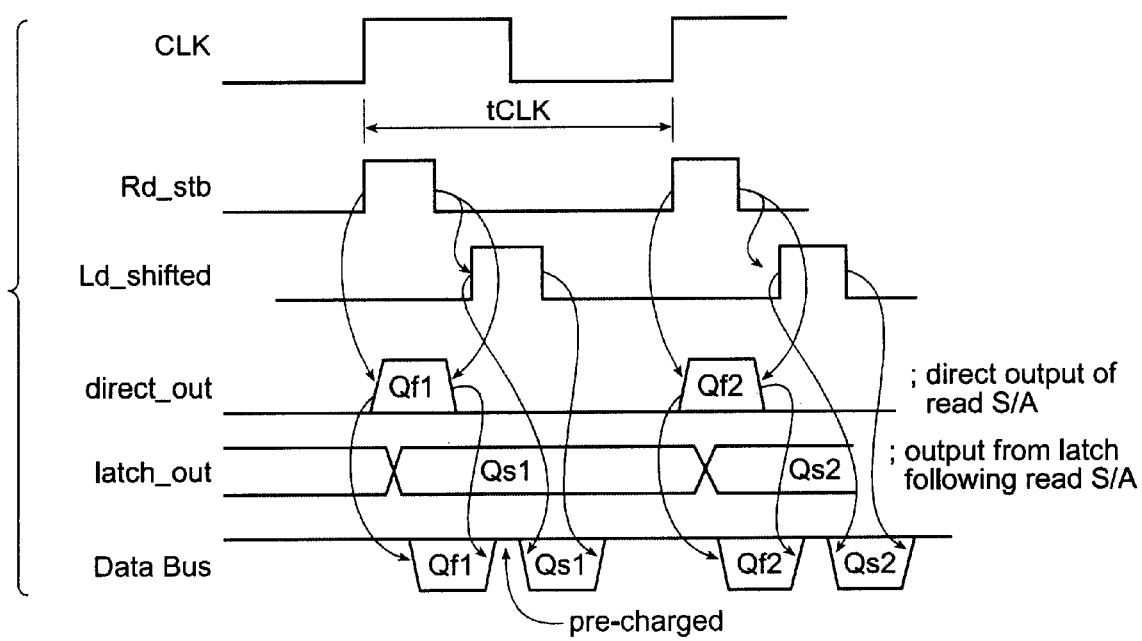
FIG. 2 is a timing diagram illustrating the operation of the memory circuit of FIG. 1 in read mode.
Figure 3:
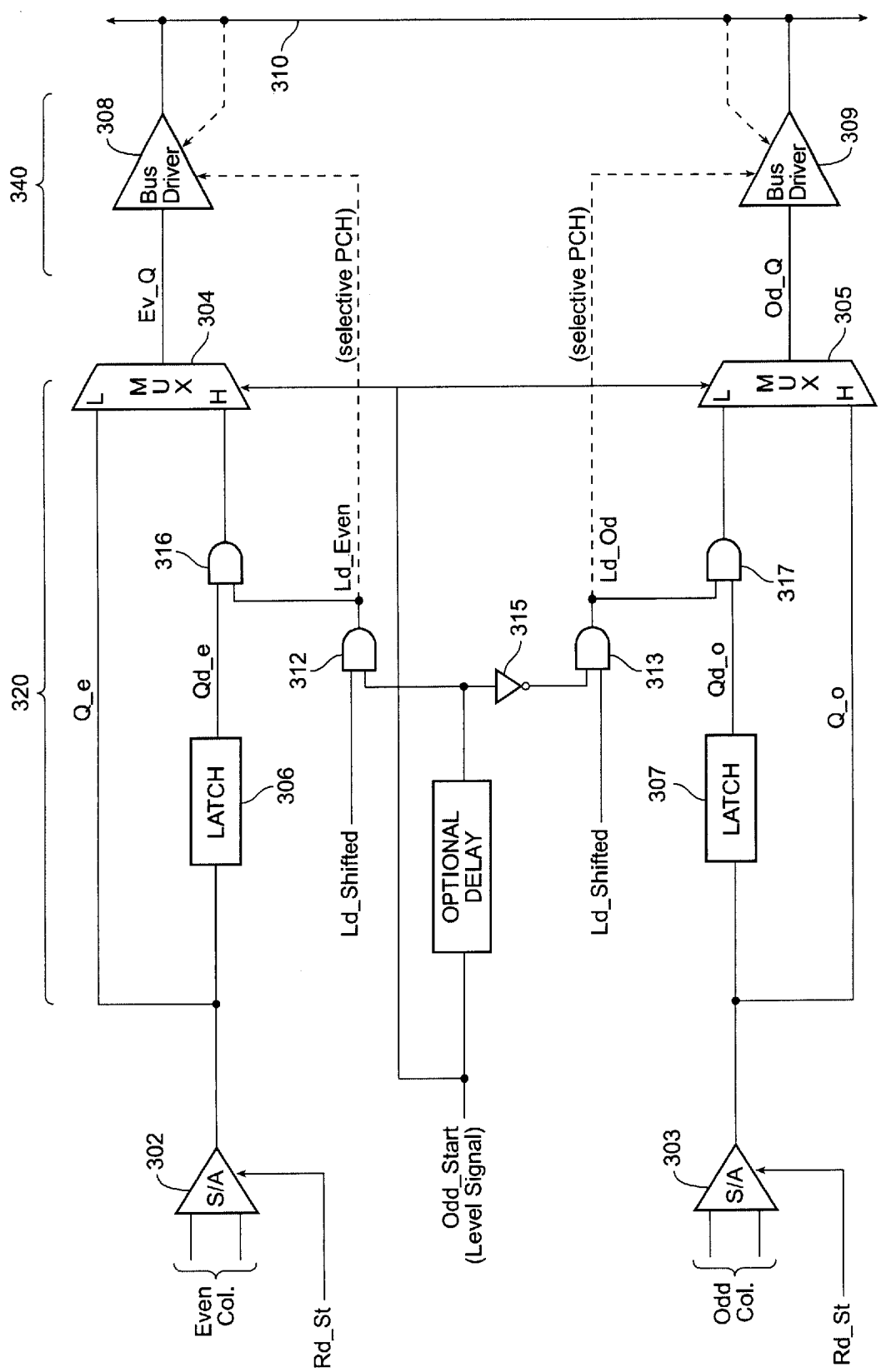
FIG. 3 shows an exemplary implementation of a data bus driver circuit for controlling the interface to the data bus in read mode according to the present invention.

The timing diagram of FIG. 2 illustrates the operation of the data bus driver of FIG. 3. The rising edge of Rd_Stb signal causes the first occurring bit of data Qf1 (either from the even column or from the odd column) to be transmitted as the direct output direct_out of one of the two sense amplifiers. The calling edge of Rd_Stb triggers the rising edge of the Ld_Shifted signal and terminates Qf1. The second occurring bit of data Qs1 appears as the latched output of the other of the two sense amplifiers. Qf1 is then driven onto the data bus by the rising edge of Rd_Stb (with a slight delay). Qs1 is driven onto the data bus in response to the rising edge of Ld_Shifted, and terminates with the falling edge of Ld_Shifted. In this fashion, two bits of data are driven onto the same data bus during one clock cycle. As indicated above, the same technique can be applied to transmit greater than two bits of data during one clock cycle.

In most high speed memory circuits it is common to use precharging techniques to reduce the switching time of the data bus. As shown in FIG. 2, before the second data is driven onto the data bus, the data bus is precharged back to its initial level (e.g., high in FIG. 2). This precharging, however, does take some time and is unnecessary when both bits of data are the same (i.e., no switching needs to take place). In one embodiment, the present invention eliminates the data bus precharging when both read data are the same. This is accomplished by feeding the first data that is already on the data bus back to the bus driver, comparing it with the second data and logically combining the result with the precharge signal. The feedback from the data bus to the driver circuit is shown in dotted lines on FIG. 3.

Figure 4:
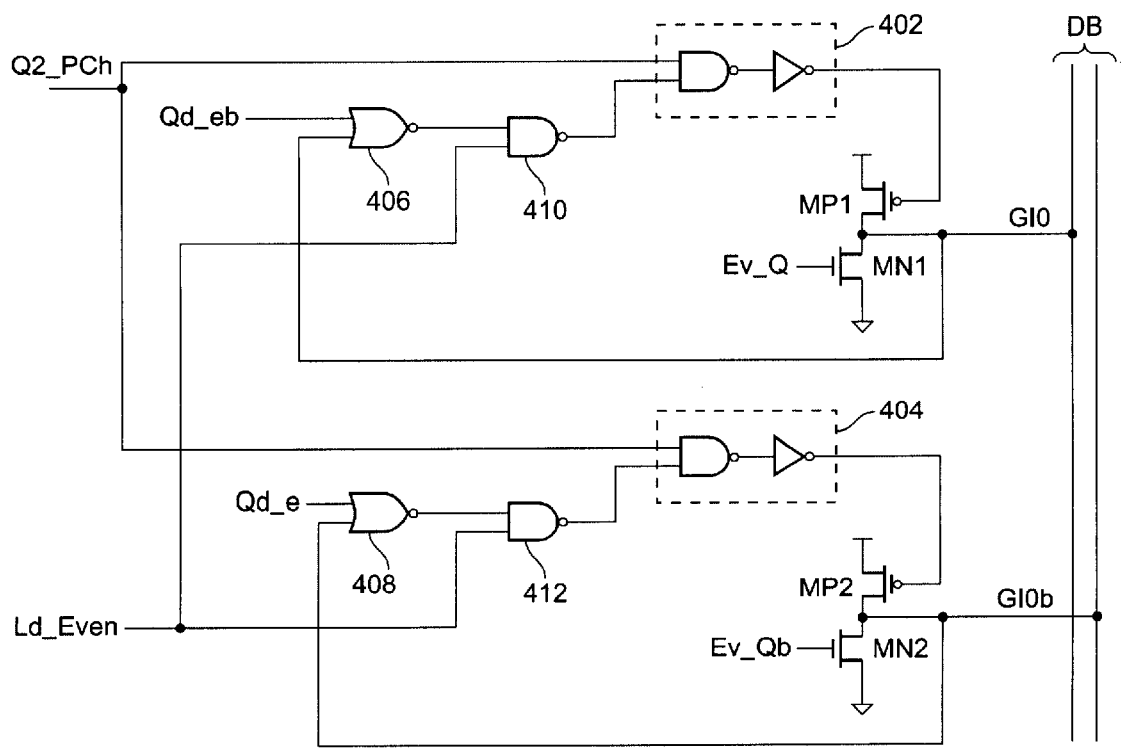
FIG. 4 is a more detailed circuit diagram of parts of the data bus driver showing the improved precharge mechanism according to an exemplary embodiment of the present invention.

Referring to FIG. 4, there is shown an example of part of the bus driver in greater detail depicting the precharging technique according to the present invention. In the exemplary circuit implementation shown in FIG. 4, the data bus is a double-ended bus that is made up of two complementary global I/O interconnect lines GIO and GIOb. A logic "1" on the data bus would be represented by a logic high level on GIO and a logic low level on GIOb, and a logic "0" would be represented by a logic high level on GIOb and a logic low level on GIO. The diagram in FIG. 4 shows the driver circuit for only one column; the even column. The circuit is the same for the odd column. In this embodiment, the data bus DB is precharged high by transistors MP1 and MP2, and driven low by transistors MN1 and MN2. Transistors MN1 and MN2 are driven by signals Ev_Q and Od_Q, respectively (see FIG. 3). Transistors MP1 and MP2 are driven by logic circuitry that combines the second data precharge signal Q2_PCH with latched sense amplifier output Qd_e (its inverse Qd_eb for GIOb), and the driver enable signal Ld_Even.

In operation, the data bus must always get precharged after the last data in the cycle and before the next set of multiple bits (i.e., before the next clock cycle begins). In the exemplary embodiment of the double data rate memory device described here, the automatic precharge must take place after the second data and before the next set of double bits. This is accomplished by a negative pulse on the second data precharge signal Q2_PCH. When Q2_PCH goes low, AND gates 402 and 404 respectively drive the gate terminals of transistors MP1 and MP2 low. Transistors MP1 and MP2 thus turn on pulling both lines GIO and GIOb to logic high (precharge level). Otherwise, Q2_PCH stays high during the window of time defined by one clock period and precharging is accomplished by logic circuitry inside the bus driver circuit. A NOR gate 406 compares the level of the first data on GIO with that of the inverted version of the second (latched) data Qd_ed. If the first data Q1 on the data bus is a logic low, GIO is low and GIOb is high. Given a non-matching second data Q2 of logic high, Qd_eb would be low, resulting in a logic high at the output of NOR 406. NAND gate 410 receives Ld_Even at one input as the enable signal for the driver. The signal Ld_Even is therefore high and combined with a high at the output of NOR 406, causes the output of NAND gate 410 to go low. This in turn causes the output of AND gate 402 to go low. Transistor MP1 turns on pulling GIO up to a high level, thus precharging GIO. For the GIOb half of the circuit, GIOb need not be driven as it was already in high state.

When the second data Q2 is the same as the first data Q1 (e.g., logic low), Qd_eb would be high, driving the output of NOR gate 406 low. The output of NAND gate 410 is therefore pulled high. With Q2_PCH also at a high level, AND gate 402 applies a high level to the gate terminal of transistor MP1 keeping transistor MP1 off and GIO low. Thus, when the second of the two pre-fetch data is of the same logic level as the first, the step of precharging is eliminated. It is to be understood that the implementation shown in FIG. 4 is for illustrative purposes only, and that those skilled in the art appreciate that there are alternative ways of eliminating the precharge when not necessary.

Figure 5:
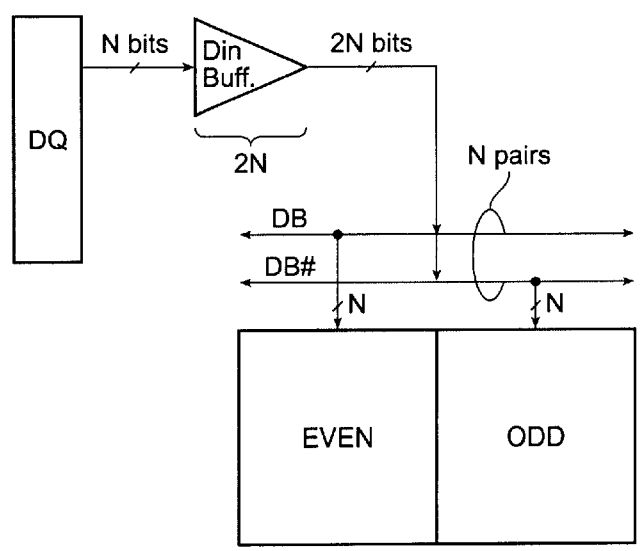
FIG. 5 is a simplified diagram illustrating the memory circuit according to the present invention in the write mode of operation.

In another embodiment, the present invention provides improvements in write mode of operation. In a specific embodiment, the present invention uses single-ended signaling for processing write data. Unlike the read data that is transmitted double-ended requiring a pair of interconnect lines per bit, a single-ended write data requires only one interconnect line per bit. Given the reduction in number of data buses achieved by the embodiment described above, instead of using even data buses for writing even data and odd data buses for writing odd data, the present invention uses the "true" half of the data bus interconnect lines for one half of the memory array (either even or odd), and the "complementary" half of the data bus interconnect lines for the other half of the memory array. That is, N double-ended bus lines are used to carry 2N single-ended write data. FIG. 5 is a highly simplified block diagram showing the bus architecture for write mode of operation according to the present invention. As shown in FIG. 5, 2N write data bits are carried by N double-ended data bus lines.

In conclusion, the present invention provides methods and circuitry for implementing memory devices with data IQ architectures capable of carrying in one clock cycle multiple bits of data per bus line. Instead of increasing the physical number of I/O interconnect lines to match the increased number of data bits being processed by the multiple data rate memory device, the present invention provides a time sharing scheme that processes the multiple bits of data with a minimum number of I/O lines. While the above is a complete description of the preferred embodiment of the present invention, it is possible to use various alternatives, modifications and equivalents. For example, the invention has been described in the context of a double data rate memory device for illustrative purposes only. The teachings of the present invention clearly apply to memory device with multiple data rates higher than two. Further, the circuit of FIG. 3 is only one implementation of the functionality of the present invention and those skilled in the art of circuit design appreciate that there are many alternative ways of implementing the circuitry. Therefore, the scope of the present invention should be determined not with reference to the above description but should, instead, be determined with reference to the appended claims, along with their full scope of equivalents.

What is claimed is:

1. A memory circuit that operates according to a periodic clock signal, the memory circuit comprising:

N data registers respectively coupled to N data buses, where N is a positive integer;

an array of memory cells coupled to the N data buses; and precharge circuitry coupled to the N data buses, wherein the precharge circuitry is configured not to precharge a data bus during the single period of the periodic clock when two successive bits of the M data bits have the same value;

wherein the circuit is configured such that each of the N data buses is capable of carrying M bits of data during a single period of the periodic clock signal, where M is a positive integer greater than one;

wherein each data bus comprises first and second complementary interconnect lines, and wherein, for each of the first and second complementary interconnect lines, the precharge circuitry comprises a precharge transistor coupled to an associated interconnect line and configured to pull the associated interconnect line to a precharge potential in response to a precharge control signal; and precharge logic coupled to compare the value of a current data bit on the associated interconnect line with a value of a succeeding data bit, and to generate the precharge control signal.

2. The memory circuit of claim 1 wherein the precharge logic receives an automatic precharge signal in response to which the precharge control signal precharges an associated interconnect line after the last one of the M bits of data is driven onto the associated interconnect line.

3. A method of transmitting data in a memory circuit that operates according to a periodic clock signal, the memory circuit having N data registers respectively coupled to N data buses, where N is a positive integer, an array of memory cells coupled to the N data buses, and precharge circuitry coupled to the N data buses, wherein the precharge circuitry is configured not to precharge a data bus during the single period of the periodic clock when two successive bits of the M data bits have the same value, wherein the circuit is configured such that each of the N data buses is capable of carrying M bits of data during a single period of the periodic clock signal, where M is a positive integer greater than one, wherein each data bus comprises first and second complementary interconnect lines, and wherein, for each of the first and second complementary interconnect lines, the precharge circuitry comprises a precharge transistor coupled to an associated interconnect line and configured to pull the associated interconnect line to a precharge potential in response to a precharge control signal, and precharge logic coupled to compare the value of a current data bit on the associated interconnect line with a value of a succeeding data bit, and to generate the precharge control signal;

the method of transmitting data comprising:

transmitting a first bit of data on the interconnect lines during a first portion of a single period of the clock signal; and transmitting a second bit of data on the interconnect lines during a second portion of the single period of the clock signal.

4. The method of claim 3 further comprising triggering an edge of the second bit of data in response to an edge of the first bit of data.

5. The method of claim 3 further comprising:

precharging the interconnect lines before a subsequent period of clock signal immediately following the single period of the clock signal.

6. The method of claim 5 further comprising:

comparing a value of the first bit of data to a value of the second bit of data;

precharging the interconnect lines if the value of the first bit of data is different that the value of the second bit of data; and not precharging the interconnect lines if the value of the first bit of data is the same as the value of the second bit of data.

7. A method of operating a semiconductor memory device, the semiconductor memory device having N data registers respectively coupled to N data buses, where N is a positive integer, an array of memory cells coupled to the N data buses, and precharge circuitry coupled to the N data buses, wherein the precharge circuitry is configured not to precharge a data bus during the single period of the periodic clock when two successive bits of the M data bits have the same value, wherein the circuit is configured such that each of the N data buses is capable of carrying M bits of data during a single period of the periodic clock signal, where M is a positive integer greater than one, wherein each data bus comprises first and second complementary interconnect lines, and wherein, for each of the first and second complementary interconnect lines, the precharge circuitry comprises a precharge transistor coupled to an associated interconnect line and configured to pull the associated interconnect line to a precharge potential in response to a precharge control signal, and precharge logic coupled to compare the value of a current data bit on the associated interconnect line with a value of a succeeding data bit, and to generate the precharge control signal;

the method comprising:

selecting a plurality of data in one clock cycle from an array of memory cells in read mode;

determining a sequence of the plurality of data;

time shifting each of the plurality of data according to the sequence; and driving the plurality of data onto a single data bus in the sequence within one clock cycle.

8. The memory circuit of claim 1 wherein the circuit is further configured to transmit the M bits of data in a self-timed manner wherein one edge of a first bit of data triggers an edge of a succeeding bit of data.

9. The memory circuit of claim 1 further comprising a data bus driver coupled between the memory array and the N data buses, the data bus driver comprising:

a first stage coupled to the array of memory cells and configured to simultaneously receive M bits of data per data bus and to determine a sequence of the M bits of data; and a second stage coupled between the first stage and the data buses and configured to selectively drive the M bits of data onto a data bus.

10. The memory circuit of claim 9 wherein the first stage of the bus driver comprises:

a direct path and a delayed path for each one of the M bits of data; and a selection circuit coupled to select either the direct path or the delayed path for each one of the M bits of data.

11. The memory circuit of claim 10 wherein the second stage of the bus driver comprises M drivers coupled between the selection circuit and the data bus, the M drivers being enabled according to the sequence.

12. The memory circuit of claim 1 wherein each of the N data buses comprises a pair of interconnect lines to process double-ended read data, and wherein, the memory circuit is further configured to process single-ended data in write mode, wherein the pair of interconnect lines in each of the N data buses respectively carry two single-ended bits of write data during write mode.

* * * * *